US011636574B2

(12) United States Patent
Wu

(10) Patent No.: US 11,636,574 B2
(45) Date of Patent: Apr. 25, 2023

(54) SCALING METHOD AND APPARATUS, DEVICE AND MEDIUM

(71) Applicant: Shanghai Lilith Technology Corporation, Shanghai (CN)

(72) Inventor: Di Wu, Shanghai (CN)

(73) Assignee: Shanghai Lilith Technology Corporation, Shanghai (CN)

(*) Notice: Subject to any disclaimer, the term of this patent is extended or adjusted under 35 U.S.C. 154(b) by 0 days.

(21) Appl. No.: 17/281,513

(22) PCT Filed: Dec. 14, 2018

(86) PCT No.: PCT/CN2018/121227
§ 371 (c)(1),
(2) Date: Mar. 30, 2021

(87) PCT Pub. No.: WO2020/077791
PCT Pub. Date: Apr. 23, 2020

(65) Prior Publication Data
US 2022/0044355 A1 Feb. 10, 2022

(30) Foreign Application Priority Data
Oct. 16, 2018 (CN) .......................... 201811201333.5

(51) Int. Cl.
*G06T 3/40* (2006.01)
*G06F 30/10* (2020.01)
*G06T 19/20* (2011.01)

(52) U.S. Cl.
CPC .............. *G06T 3/40* (2013.01); *G06F 30/10* (2020.01); *G06T 19/20* (2013.01);
(Continued)

(58) Field of Classification Search
CPC ....... G06T 3/40; G06T 19/20; G06T 2210/04; G06T 2210/21; G06T 2219/2016; G06F 30/10; G06F 30/13
See application file for complete search history.

(56) References Cited

U.S. PATENT DOCUMENTS 8,187,201 B2 5/2012 Lynn
2005/0270311 A1* 12/2005 Rasmussen ............. G06T 11/40
345/677

(Continued)

FOREIGN PATENT DOCUMENTS

CN 1973304 12/2010
CN 102004623 4/2011
(Continued)

*Primary Examiner* — YuJang Tswei
(74) *Attorney, Agent, or Firm* — David R. Stevens; Stevens Law Group

(57) ABSTRACT

The present invention relates to a scaling method, including: for each of coordinate axis directions of a complex object: assigning a scale mode to each sub-object in the complex object in the direction; for each cross section of the complex object perpendicular to the direction, calculating a scale ratio limit of the cross section; combining adjacent cross sections with the same scale ratio to obtain a segmented scale ratio range of the complex object in the direction; according to an adjustment target value of the complex object in the direction, calculating the segmented scale ratio of the complex object in the direction; and according to the scale ratio of each sub-object in each direction, calculating a new position range of each sub-object and adjusting a size of the complex object. In addition, the present invention further relates to a scaling apparatus, a device, and a medium.

16 Claims, 12 Drawing Sheets

(52) U.S. Cl.
CPC ...... *G06T 2210/04* (2013.01); *G06T 2210/21* (2013.01); *G06T 2219/2016* (2013.01)

(56) References Cited

U.S. PATENT DOCUMENTS

| | | | |
|---|---|---|---|
| 2008/0085383 A1* | 4/2008 | Merrill | B29C 55/06 |
| | | | 428/29 |
| 2008/0232712 A1* | 9/2008 | Matsui | G06T 11/60 |
| | | | 382/277 |
| 2010/0272357 A1* | 10/2010 | Maxwell | G06T 7/11 |
| | | | 382/173 |
| 2013/0057542 A1 | 3/2013 | Takenaka | |
| 2013/0142396 A1* | 6/2013 | Fletcher | G06T 7/32 |
| | | | 382/106 |
| 2013/0147800 A1* | 6/2013 | Ogata | G06T 17/00 |
| | | | 345/420 |
| 2015/0195471 A1* | 7/2015 | Kweon | G06T 1/00 |
| | | | 250/208.1 |
| 2017/0053167 A1* | 2/2017 | Ren | G06T 3/40 |
| 2018/0033149 A1* | 2/2018 | Jeong | H04N 5/23219 |
| 2018/0322708 A1* | 11/2018 | Luccin | G06T 17/05 |

FOREIGN PATENT DOCUMENTS

| | | |
|---|---|---|
| CN | 102201126 | 9/2011 |
| CN | 102750724 | 10/2012 |
| CN | 102789532 | 11/2012 |
| CN | 103134478 | 6/2013 |
| CN | 104392032 | 3/2015 |
| CN | 106028117 | 10/2016 |
| CN | 106846254 | 6/2017 |
| CN | 107547931 | 1/2018 |
| CN | 108347615 | 7/2018 |
| DE | 4303071 | 10/1993 |
| EP | 1658558 | 9/2008 |
| JP | 5790345 | 10/2015 |
| WO | 2013123636 | 8/2013 |
| WO | 2014082278 | 6/2014 |

* cited by examiner

SCALING METHOD AND APPARATUS, DEVICE AND MEDIUM

TECHNICAL FIELD

The present application relates to a scaling method and apparatus, a device and a medium.

BACKGROUND

In a process of designing a two-dimensional or three-dimensional space, there is often a need to adjust a size of an object, such as lengthening or shortening, etc. In the technical solution of the prior art, an independent proportional stretching method in each dimension is usually used to ensure that a position percentage of each point relative to a shape of the object remains unchanged before and after stretching.

However, during designing, it is normal to perform an operation on a complex object. The complex object refers to an object composed of objects having more than one material, color, transparency, size, or direction. When the complex object is stretched or shortened in equal proportions, if the method of equal proportional stretching is still separately adopted for each dimension, deformation or distortion of some sub-objects having specific shapes often occurs in the complex object. In order to avoid the distortion or deformation, the complex object may be remade according to the desired size with complex operations and inconvenience.

SUMMARY

An object of the present invention is to provide a scaling method for two-dimensional or three-dimensional design.

A first aspect of the present invention provides a scaling method, including: for each of coordinate axis directions of a complex object: assigning a scale mode to each sub-object in the complex object in the direction, where the scale mode includes: proportional stretching, non-stretching and unit repetition; for each cross section of the complex object perpendicular to the direction, calculating a scale ratio limit of the cross section; combining adjacent cross sections with the same scale ratio to obtain a segmented scale ratio range of the complex object in the direction; according to an adjustment target value of the complex object in the direction, calculating a segmented scale ratio of the complex object in the direction; and according to a scale ratio of each sub-object in each direction, calculating a new position range of each sub-object and adjusting a size of the complex object.

In this method, no local distortion is caused when the size of the object is modified after the object is designed or processed.

Further, for each cross section of the complex object perpendicular to the direction, the calculating a scale ratio limit of the cross section includes: determining whether the cross section intersects one or more sub-objects; and if no, setting no limit on the scale ratio; or if yes, limiting the scale ratio of the cross section to not exceed a scale limit value of the sub-object that intersects the cross section in the direction.

Further, according to an adjustment target value of the complex object in the direction, the calculating a segmented scale ratio of the complex object in the direction may include: determining whether the target value exceeds a maximum or minimum value in the direction; if the target value exceeds the maximum value, adjusting the target value to the maximum value; if the target value is lower than the minimum value, adjusting the target value to the minimum value; otherwise, separately calculating a theoretical scale ratio R of each segment in the complex object; and if the value R obtained from a certain segment is not within the scale ratio range of the segment, set the theoretical scale ratio of the segment as a limiting value R' closest to R in the scale ratio range, and adjust scale ratios of other segments according to the value R'.

Further, the method may further include: a step of decomposing the complex object into sub-objects.

Further, when a scale mode of unit repetition is assigned to the sub-object, if a to-be-adjusted target length of the sub-object is not an integral multiple of a repeating unit, a part of the last unit is intercepted according to the final length, or units whose quantity is rounded down are retained and arranged in the center.

Further, the complex object is a two-dimensional object or a three-dimensional object.

A second aspect of the present invention provides a scaling apparatus, including: a scale mode determining unit, configured to assign a scale mode to each sub-object in a complex object in each coordinate axis direction, where the scale mode includes: proportional stretching, non-stretching, and unit repetition; a scale ratio limit determining unit, configured to: for each of coordinate axis directions of the complex object, calculate a scale ratio limit of each cross section of the complex object perpendicular to the direction; a segmented scale ratio range determining unit, configured to combine adjacent cross sections with the same scale ratio to obtain a segmented scale ratio range of the complex object in each direction; a segmented scale ratio determining unit, configured to: according to an adjustment target value of the complex object in each direction, calculate a segmented scale ratio of the complex object in each direction; and an adjustment unit, configured to: according to a scale ratio of each sub-object in each direction, calculate a new position range of each sub-object, and adjust a size of the complex object.

Further, the scale ratio limit determining unit may be further configured to: for each of coordinate axis directions of the complex object: determine whether each cross section perpendicular to the direction intersects one or more sub-objects; and if no, set no limit on the scale ratio; or if yes, limit the scale ratio of the cross section to not exceed a scale limit value of the sub-object that intersects the cross section in the direction.

Further, the segmented scale ratio determining unit may be further configured to: for each of coordinate axis directions of the complex object: determine whether the target value exceeds a maximum or minimum value in the direction; if the target value exceeds the maximum value, adjust the target value to the maximum value; if the target value is lower than the minimum value, adjust the target value to the minimum value; otherwise, separately calculate a theoretical scale ratio R of each segment in the complex object; and if the value R obtained from a certain segment is not within a scale ratio range of the segment, set the theoretical scale ratio of the segment as a limiting value R' closest to R in the scale ratio range, and adjust scale ratios of other segments according to the value R'.

Further, the apparatus further includes a decomposition unit, configured to decompose the complex object into the sub-objects.

Further, the scale mode determining unit is further configured to, when a scale mode of unit repetition is assigned to the sub-object, if a to-be-adjusted target length of the sub-object is not an integral multiple of a repeating unit, a part of the last unit is intercepted by using the final length, or units whose quantity is rounded down are retained and arranged in the center.

Further, the complex object is a two-dimensional object or a three-dimensional object.

A third aspect of the present invention provides a device, and the device includes a processor and a memory, where the processor establishes a communication connection to the memory; and the processor is configured to read a program in the memory to perform the method according to any one of the first aspect and possible implementations of the first aspect.

A fourth aspect of the present invention provides a non-volatile storage medium, a program is stored in the non-volatile storage medium, and when the program is run by a computing device, the computing device performs the method according to any one of the first aspect and possible implementations of the first aspect.

Compared with the prior art, in the present invention, the size of the designed two-dimensional or three-dimensional object can be conveniently adjusted, and the deformation or distortion of the stretched object can be effectively prevented without the need of remaking.

DRAWINGS

DETAILED DESCRIPTION OF EMBODIMENTS

The present invention is further described below with reference to specific embodiments and drawings. It can be understood that the specific embodiments described herein are only for explaining the present invention, rather than limiting the present invention. In addition, for ease of description, the drawings only show a part but not all of the structures or processes related to the present invention.

In addition, "upper", "lower", "left", "right", "front", "rear", "top", "bottom", etc. used in the following description is only for facilitating the explaining of the structure of the present invention with convenience, and should not be construed as a limitation to the present invention.

Figure 4:
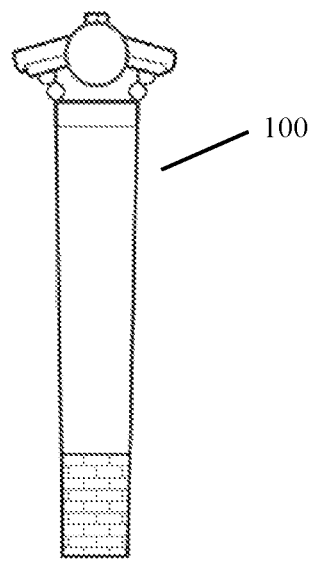
FIG. 4 is a side view of a three-dimensional complex object according to an embodiment of the present invention.
Figure 5:
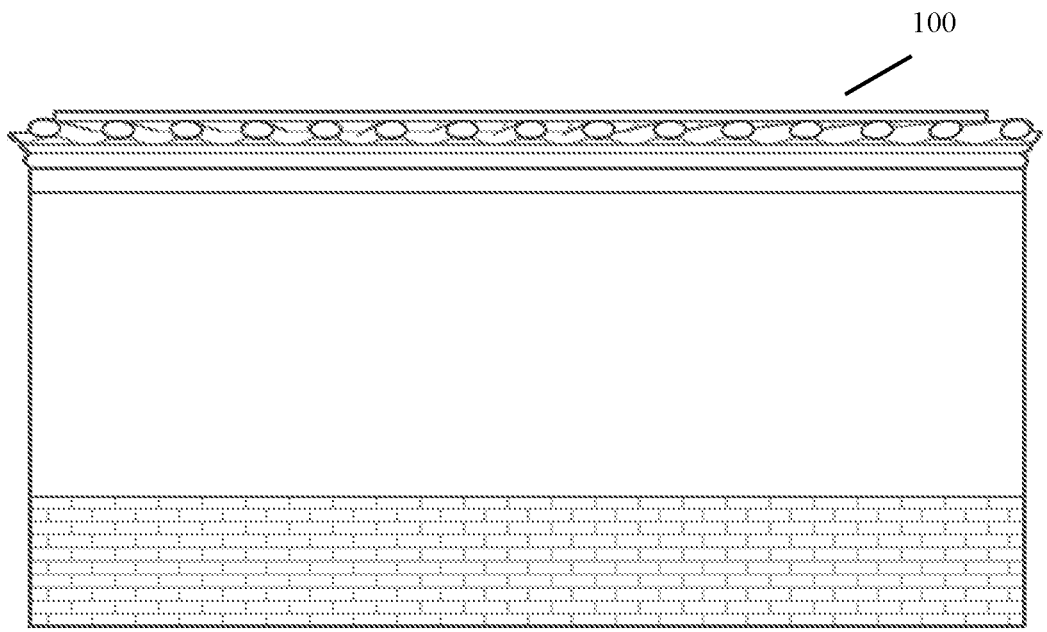
FIG. 5 is a schematic diagram of a three-dimensional complex object after being stretched in equal proportions according to an embodiment of the present invention.

In a three-dimensional space design, stretching or compressing a complex object is a common operation. For example, a palace wall 100 shown in FIG. 3 and FIG. 4 includes a wall top having a complex shape, a wall body, and a brick pattern bottom. If the palace wall 100 is stretched according to the method of the prior art, for example, the palace wall 100 is horizontally stretched in equal proportions in a length direction, to obtain a state of the palace wall 100 shown in FIG. 5. It can be seen from FIG. 5 that the brick pattern at the bottom of the palace wall 100 has been deformed after stretching, and a circular cross section of a cylindrical tile at the top has also been stretched into an oblate shape. To avoid the deformation caused by stretching, a wall needs to be remade according to a new size, which is very inconvenient.

The present invention provides a scaling method to stretch or compress the complex object such as the palace wall 100 without causing local deformation or distortion.

Figure 1:
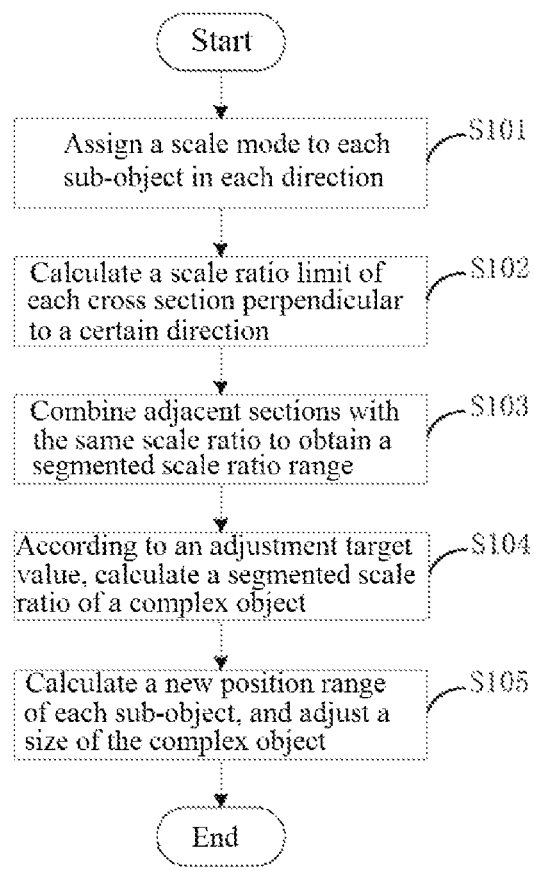
FIG. 1 is a flowchart of a scaling method according to an embodiment of the present invention.

According to an embodiment of the present invention, a scaling method is provided. As shown in FIG. 1, the method can be used for scaling of a two-dimensional object or a three-dimensional object, and specifically may include the following steps:

Step S101, for a complex object, a scale type is defined according to a coordinate axis direction, and a scale mode is assigned to each sub-object in the complex object in each coordinate axis direction. The scale mode may include one or more of proportional stretching, non-stretching, and unit repetition.

Proportional stretching: that is, expanding or reducing to a target size by proportion. This scale type may set no limitation on the size of the object by default. However, in some embodiments, the maximum and minimum values of stretching may be added as required. Non-stretching: Non-stretching keeps the percentage of the sub-object in the overall position unchanged. Unit repetition: Units are repeatedly arranged in a scaling direction, and the size is stretched or shortened by increasing or decreasing the quantity of units.

The category of unit repetition can also be used to meet the need of pasting an image. In some embodiments, the user can manually add the maximum value and the minimum value, and can define the processing manner when a target length is not an integral multiple of the unit. For example, it can be defined that, if the to-be-adjusted target length of the sub-object is not an integral multiple of the repeating unit, a part of the last unit is intercepted according to the final length, or units whose quantity is round down are retained and are arranged in the center.

Optionally, in some cases, if the complex object is not decomposed into multiple sub-objects in advance, before step S101, a step of decomposing the complex object into sub-objects may further be included. This step may be automatically performed by three-dimensional design software or an apparatus, or may be manually set by the user.

Figure 3:
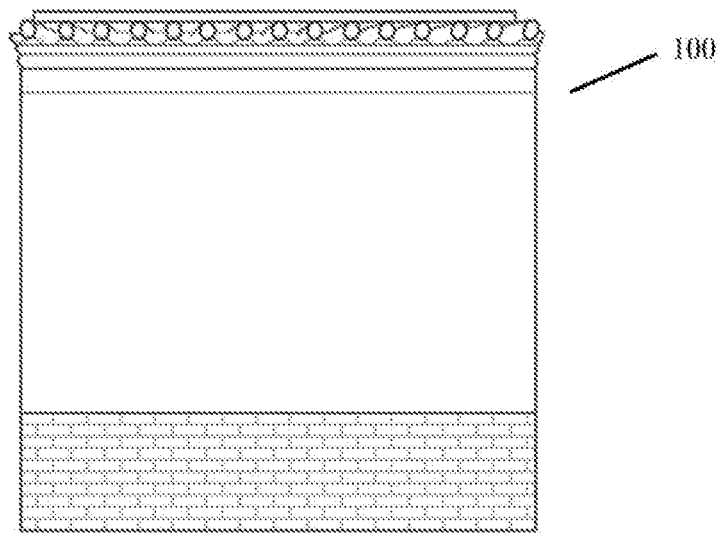
FIG. 3 is a front view of a three-dimensional complex object according to an embodiment of the present invention.

For example, for the palace wall 100 shown in FIG. 3, according to different shapes of constituent elements, the palace wall 100 can be regarded to be composed of eight sub-objects 101, 102, ... , 108, and the eight sub-objects are shown in bold in FIG. 6A-FIG. 6H. In step S101, scale modes are respectively assigned to the eight sub-objects in three directions of a three-dimensional coordinate system.

Figure 8:
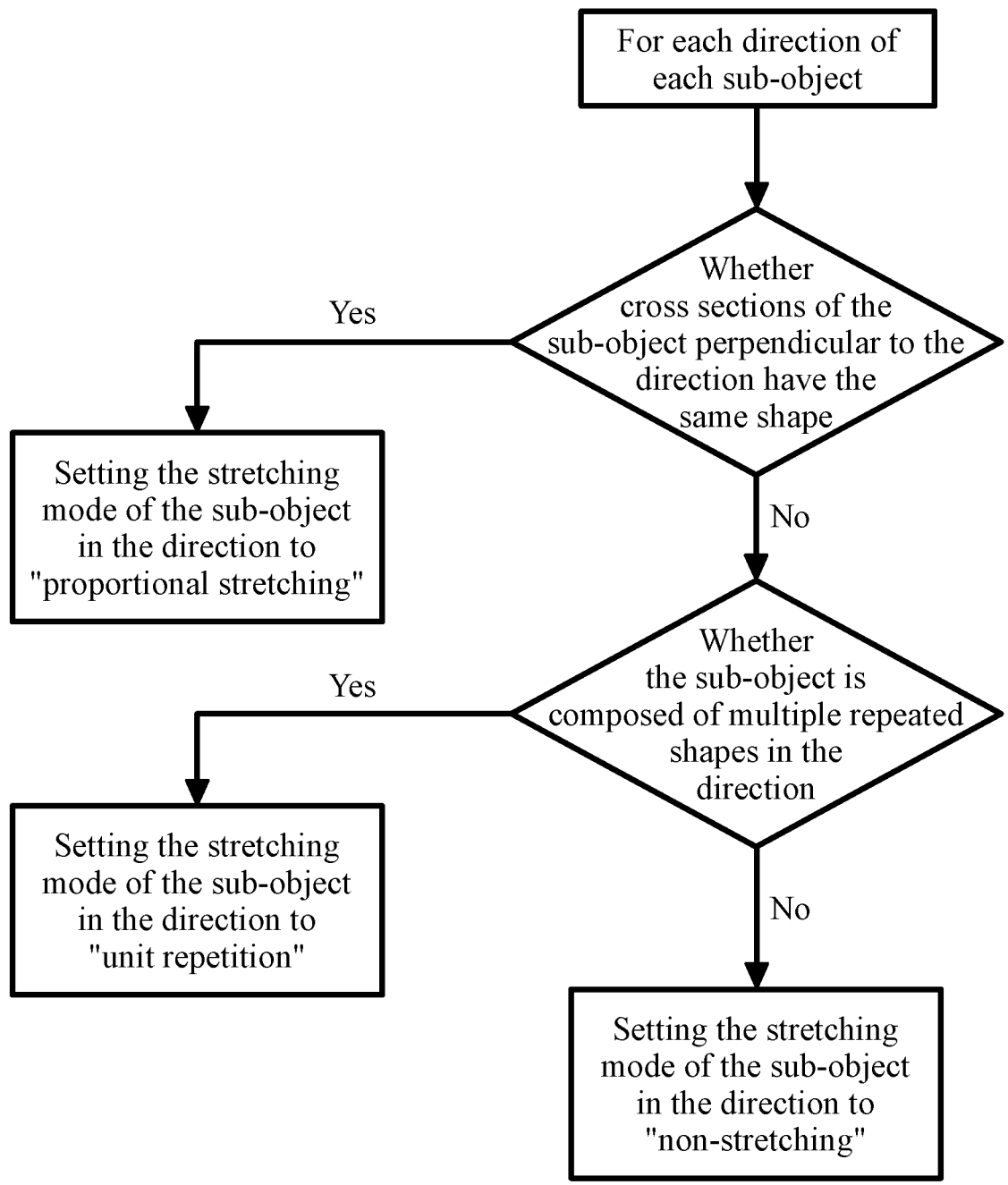
FIG. 8 is a flowchart of assigning a scale mode according to an embodiment of the present invention.

According to an embodiment of the present invention, for each direction of each sub-object, the process of assigning a scale mode may be as shown in FIG. 8. The process may include: for each direction of each sub-object, determining whether cross sections of the sub-object perpendicular to the direction have the same shape, and if yes, setting the stretching mode of the sub-object in the direction to proportional stretching; otherwise, determining whether the sub-object is composed of multiple repeated shapes in the direction, if yes, setting the stretching mode of the sub-object in the direction to unit repetition; otherwise, setting the stretching mode of the sub-object in the direction to non-stretching.

For example, for the palace wall 100 described above, a length direction of the palace wall 100 can be set to an X direction, a height direction can set to a Y direction, and a thickness direction can set to a Z direction, and then the following table can be obtained.

TABLE 1

| Sub-object No. | X direction | Y direction | Z direction |
|---|---|---|---|
| 101 | Proportional stretching | Non-stretching | Proportional stretching |
| 102 | Proportional stretching | Proportional stretching | Proportional stretching |
| 103 | Proportional stretching | Non-stretching | Proportional stretching |
| 104 | Proportional stretching | Non-stretching | Non-stretching |
| 105 | Proportional stretching | Non-stretching | Non-stretching |
| 106 | Proportional stretching | Non-stretching | Non-stretching |
| 107 | Unit repetition | Non-stretching | Non-stretching |
| 108 | Unit repetition | Non-stretching | Non-stretching |

The method shown in FIG. 8 is only an example of assigning a scale mode. In other embodiments, other methods may be used to assign a scale mode to each sub-object in each direction. In addition, if the user is not satisfied with a result obtained according to the method in FIG. 8, the user can manually modify the result.

In addition, optionally, if the user sets a scale type of a certain sub-object in a certain direction to the following two scale types, additional information needs to be provided:

Partial scale type: This type needs to specify which parts cannot be scaled and which parts can be scaled. This type can also be defined that sub-objects can be further decomposed into more sub-objects, and then scaling modes are respectively defined for the more multiple sub-objects.

Figure 6A:
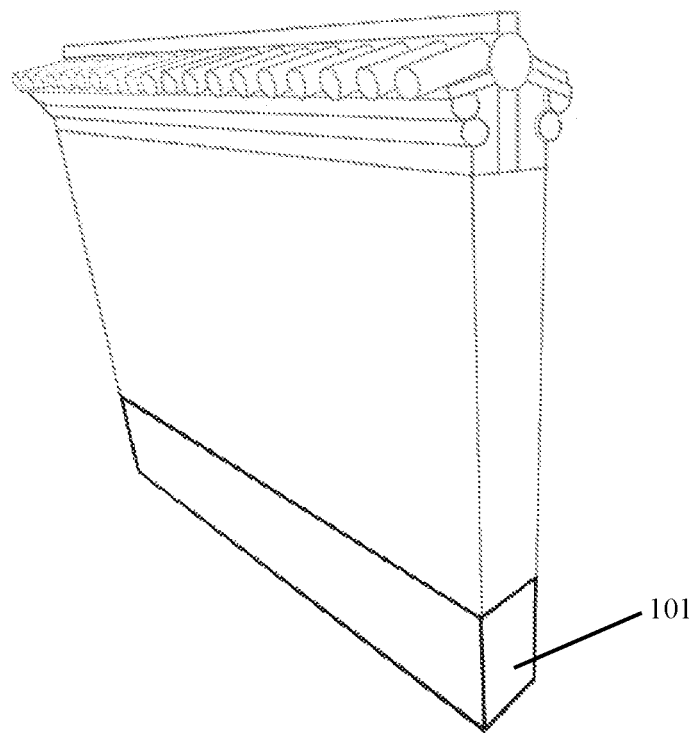
FIG. 6A-FIG. 6H are schematic diagrams of decomposing a three-dimensional complex object according to an embodiment of the present invention.
Figure 6B:
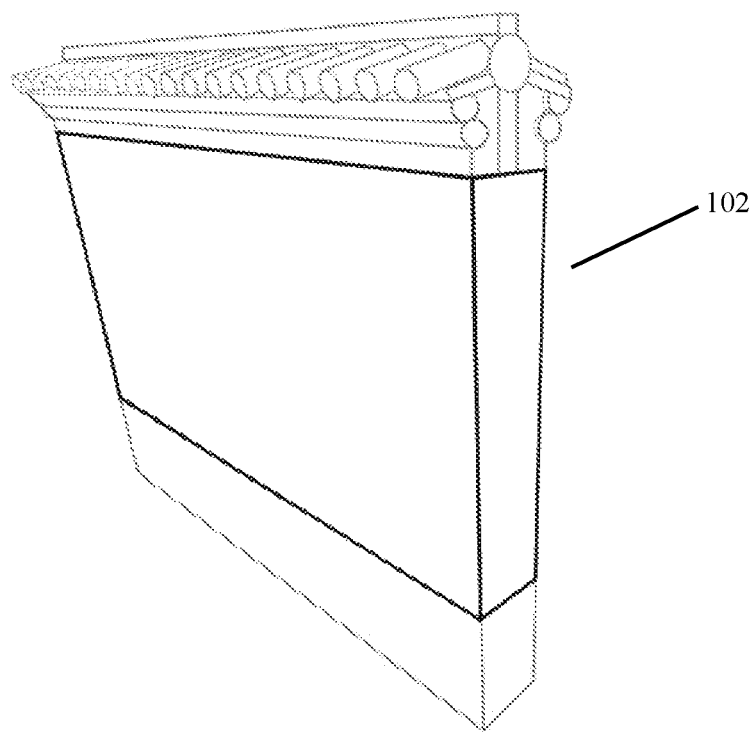
Figure 6C:
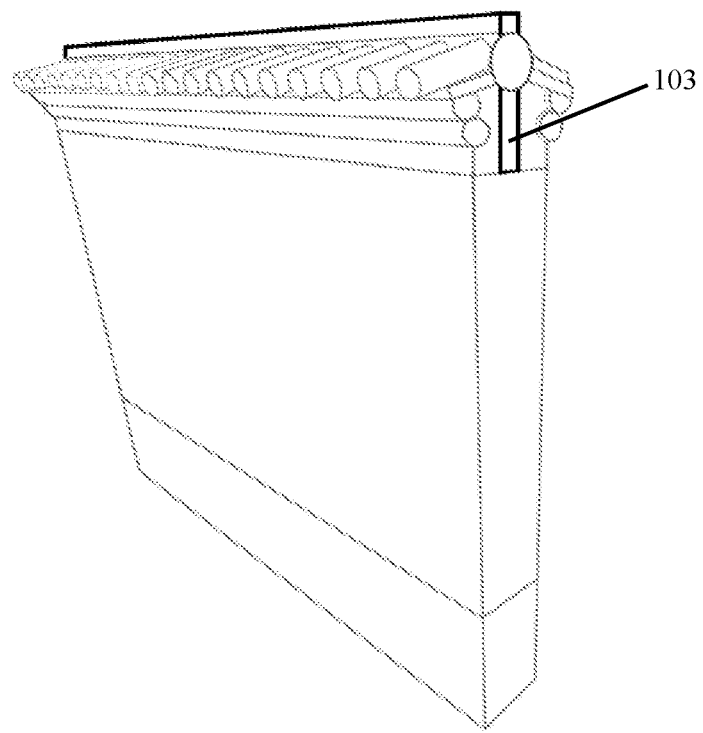
Figure 6D:
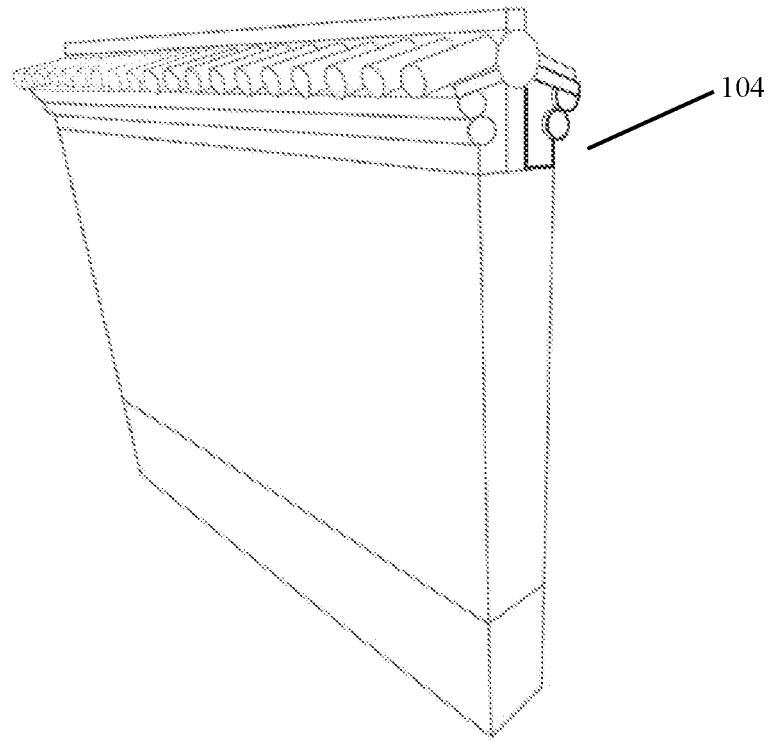
Figure 6E:
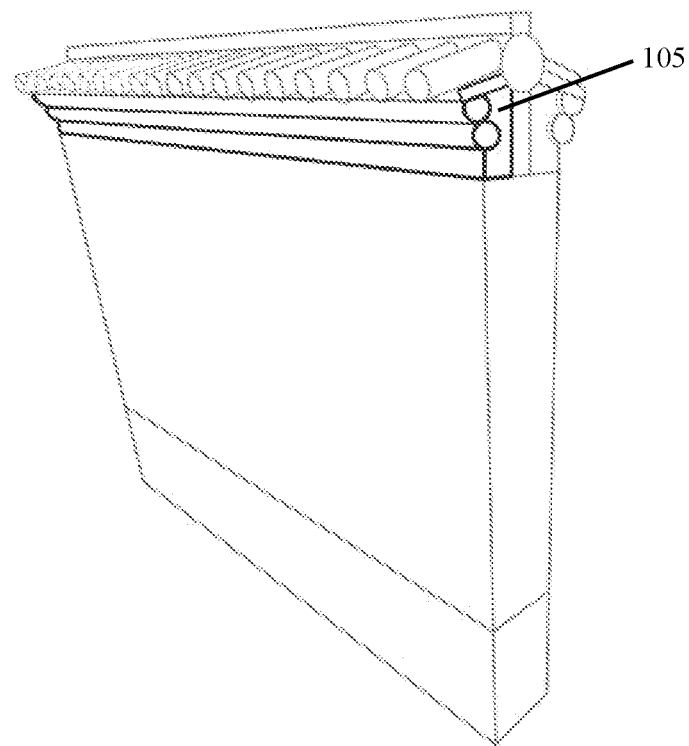
Figure 6F:
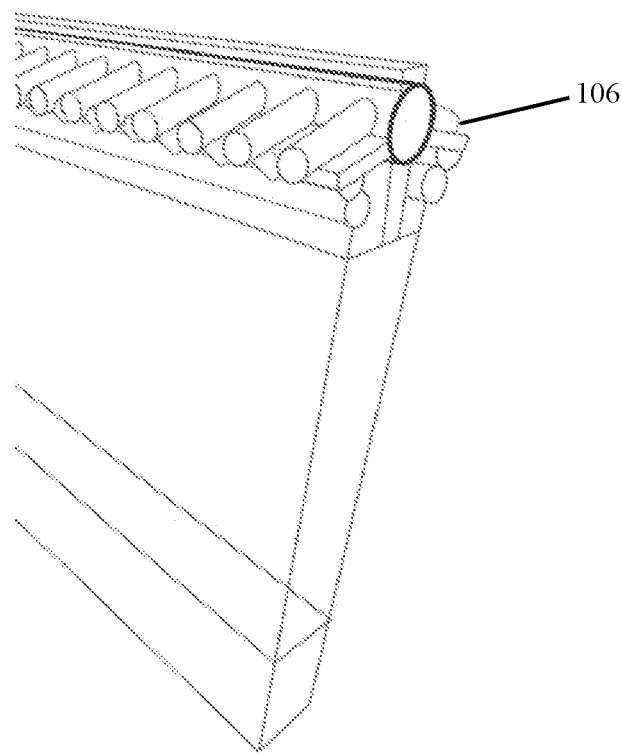
Figure 6G:
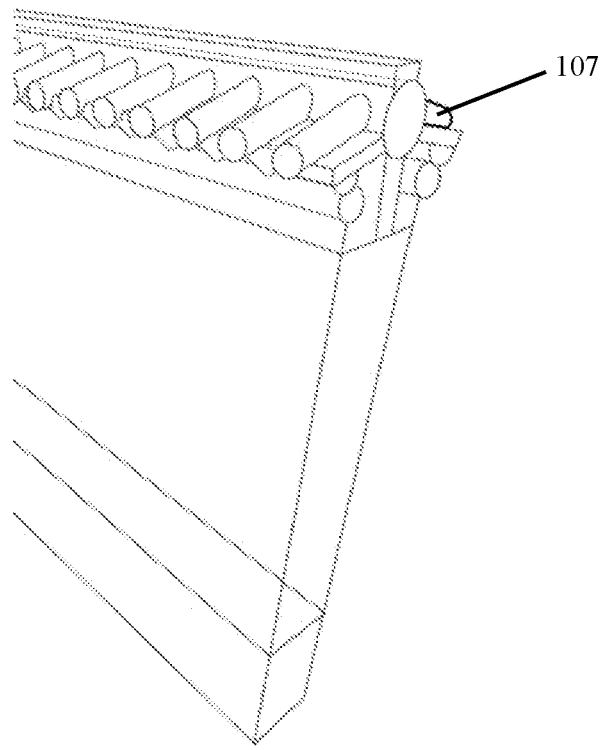
Figure 6H:
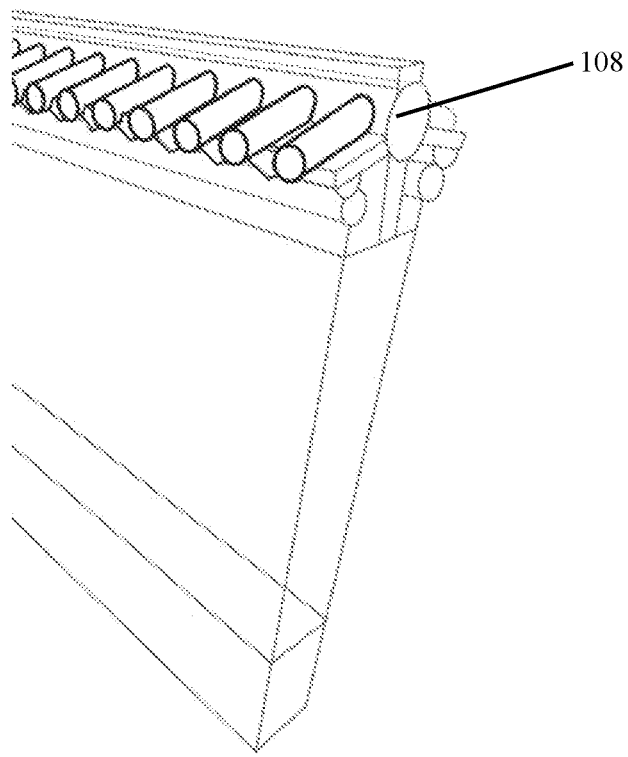
Figure 7:
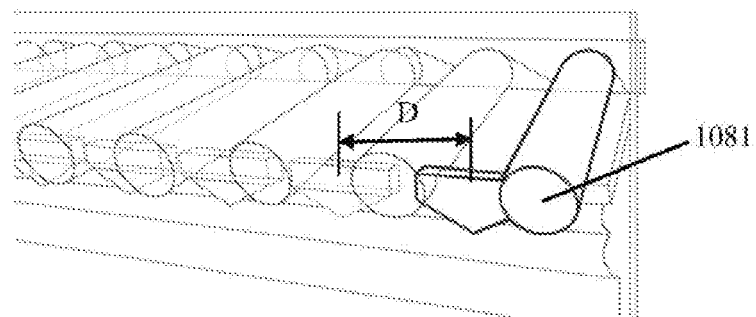
FIG. 7 is a schematic diagram of a repeating unit in a three-dimensional complex object according to an embodiment of the present invention.

Unit repetition type: This type needs to specify the content of the repeating unit and the length of the repetition period. For example, it can be learned from Table 1 that the scale mode of the sub-object 108 in the X direction as shown in FIG. 6H is unit repetition, then the repeating unit can be designated as 1081 in bold as shown in FIG. 7, and the length of the repetition period can be set as the length D in FIG. 7.

Subsequently, in step S102, for each direction of the coordinate axis, for each cross section of the complex object perpendicular to the direction, a scale ratio limit of the cross section is calculated, so that the scale ratio limits of all cross sections perpendicular to the direction can be obtained. Subsequently, in step S103, adjacent sections with the same scale ratio are combined to obtain a segmented scale ratio range of the complex object in the direction.

Figure 9:
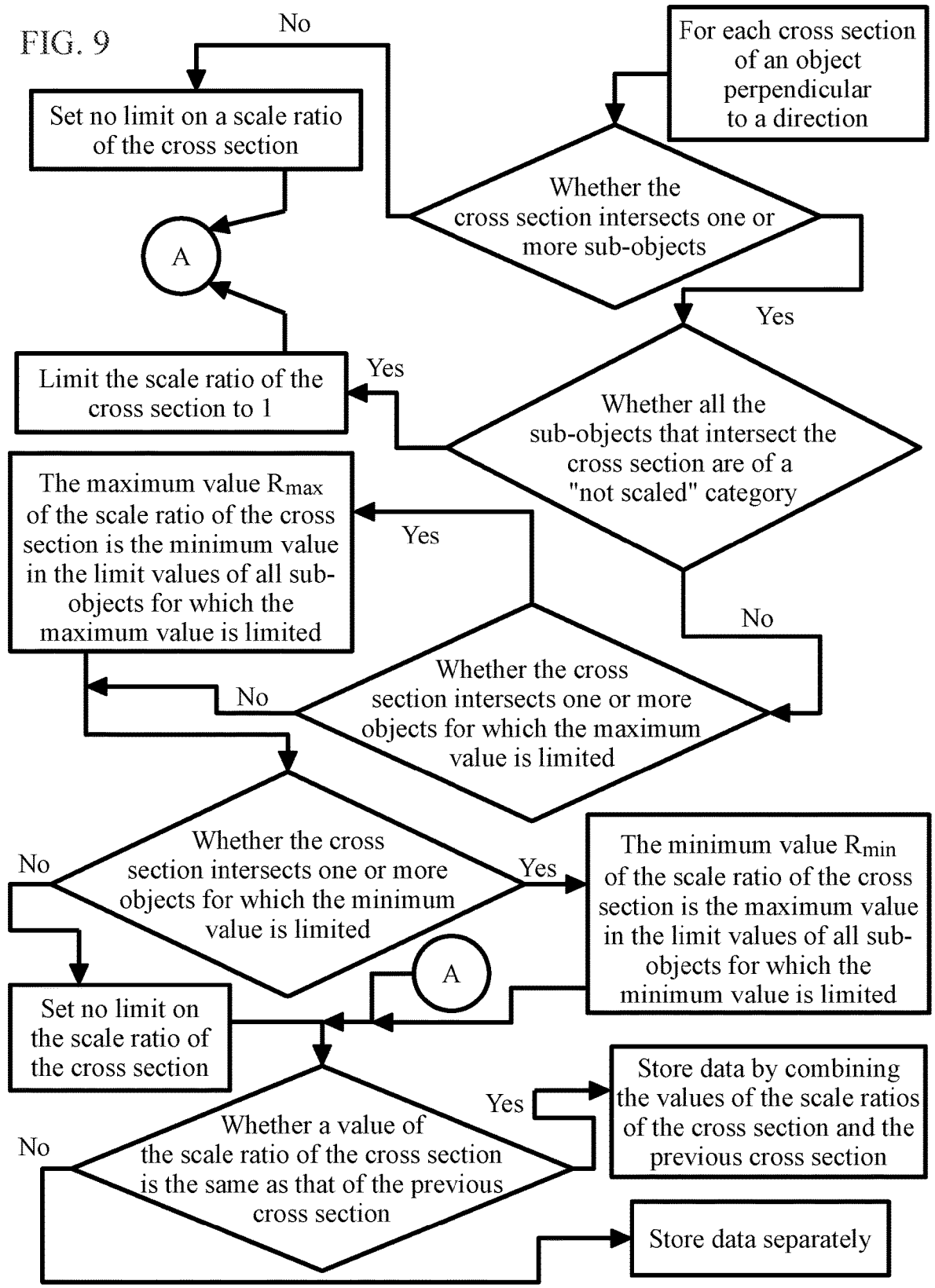
FIG. 9 is a flow chart of calculating a scale ratio limit according to an embodiment of the present invention.

According to an embodiment of the present invention, the specific process of calculating the scale ratio limits of all cross sections perpendicular to a certain direction may be as shown in FIG. 9. First, for each cross section of the complex object perpendicular to the direction, it is determined whether the cross section intersects one or more sub-objects; and if no, no limit is set on the scale ratio; or if yes, the scale ratio of the cross section is limited to not exceed a scale limit value of the sub-object that intersects the cross section in the direction.

For example, for all sections perpendicular to a certain direction, if it is determined that all the sub-objects that intersect the cross section are of the "not scaled" category, the scale ratio of the cross section is limited to 1; if the cross section intersects one or more sub-objects for which a maximum value is limited, the scale ratio of the cross section is limited to that the maximum value does not exceed a minimum value in the limit values of all the sub-objects that intersect with the cross section and for which a maximum value is limited; if the cross section intersects one or more sub-objects for which a minimum value is limited, the scale ratio of the cross section is limited to that the minimum value is not lower than a maximum value in the limit values of all sub-objects that intersect the cross section and for which a minimum value is limited; if there is no limit on the sub-object that intersects the cross section in the direction, there is no limit on the scale ratio of the cross section. Then, adjacent cross sections with the same scale ratio are combined to obtain a segmented scale ratio range of the complex object in the direction. The segmented scale ratio ranges of the complex object in other directions of the coordinate axis are calculated in sequence according to the same method. In this way, the segmented scale ratio range in each direction can be obtained.

Figure 11:
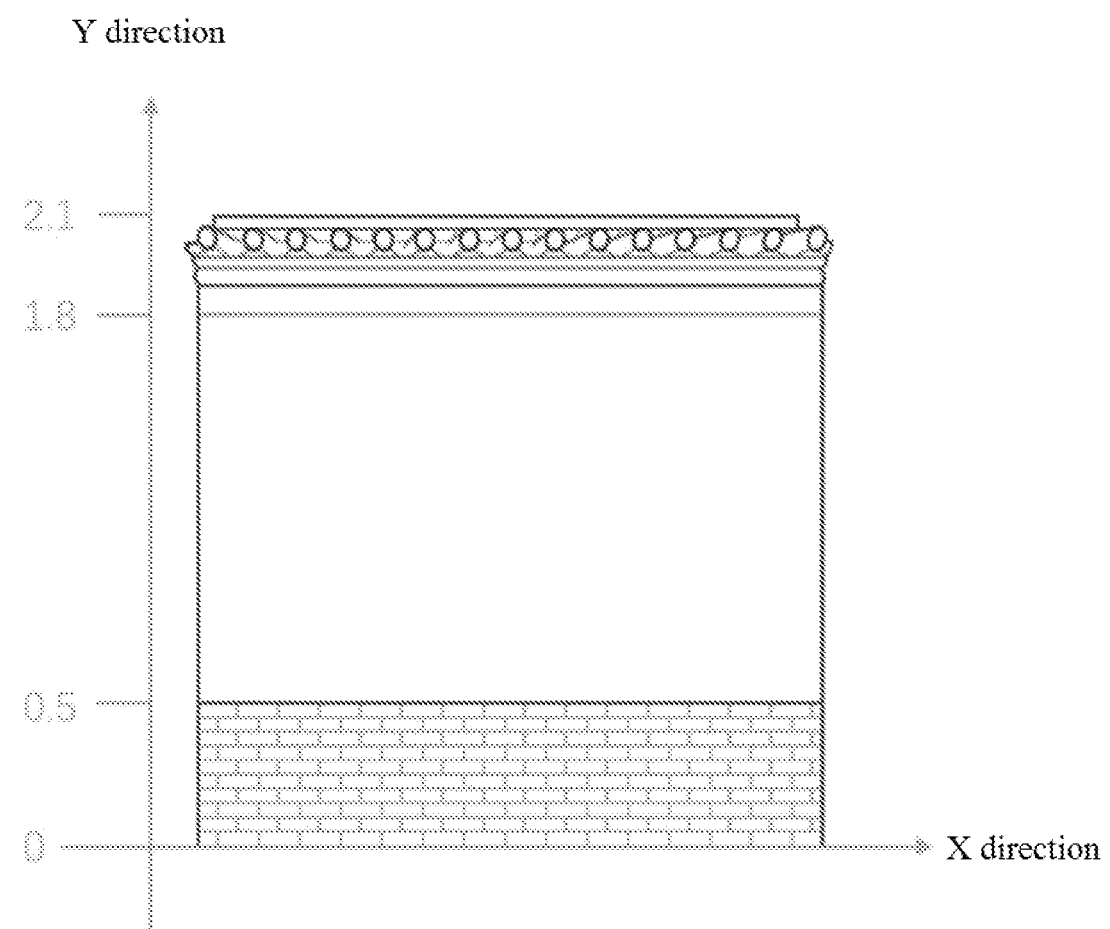
FIG. 11 is a schematic diagram of segmented scaling of a palace wall 100 in a Y direction according to an embodiment of the present invention.

For example, as shown in FIG. 11, in the above example of the palace wall, the segmented scale ratio range obtained through merging in the Y direction can be shown in a form similar to Table 2:

TABLE 2

| Position range | [0, 0.5) | [0.5, 1.8) | [1.8, 2.1) |
|---|---|---|---|
| Scale ratio | 1 | Unlimited | 1 |

The above specific process of calculating the scale ratio limits of all cross sections perpendicular to a certain direction is only an example and should not be regarded as a limitation on the present invention. At the same time, the various steps in the above process can be performed in a different order or in parallel. In some embodiments, only some of the steps or more steps can be included.

Subsequently, in step S104, according to an adjustment target value of the complex object in the direction, a segmented scale ratio of the complex object in the direction is calculated.

Figure 10:
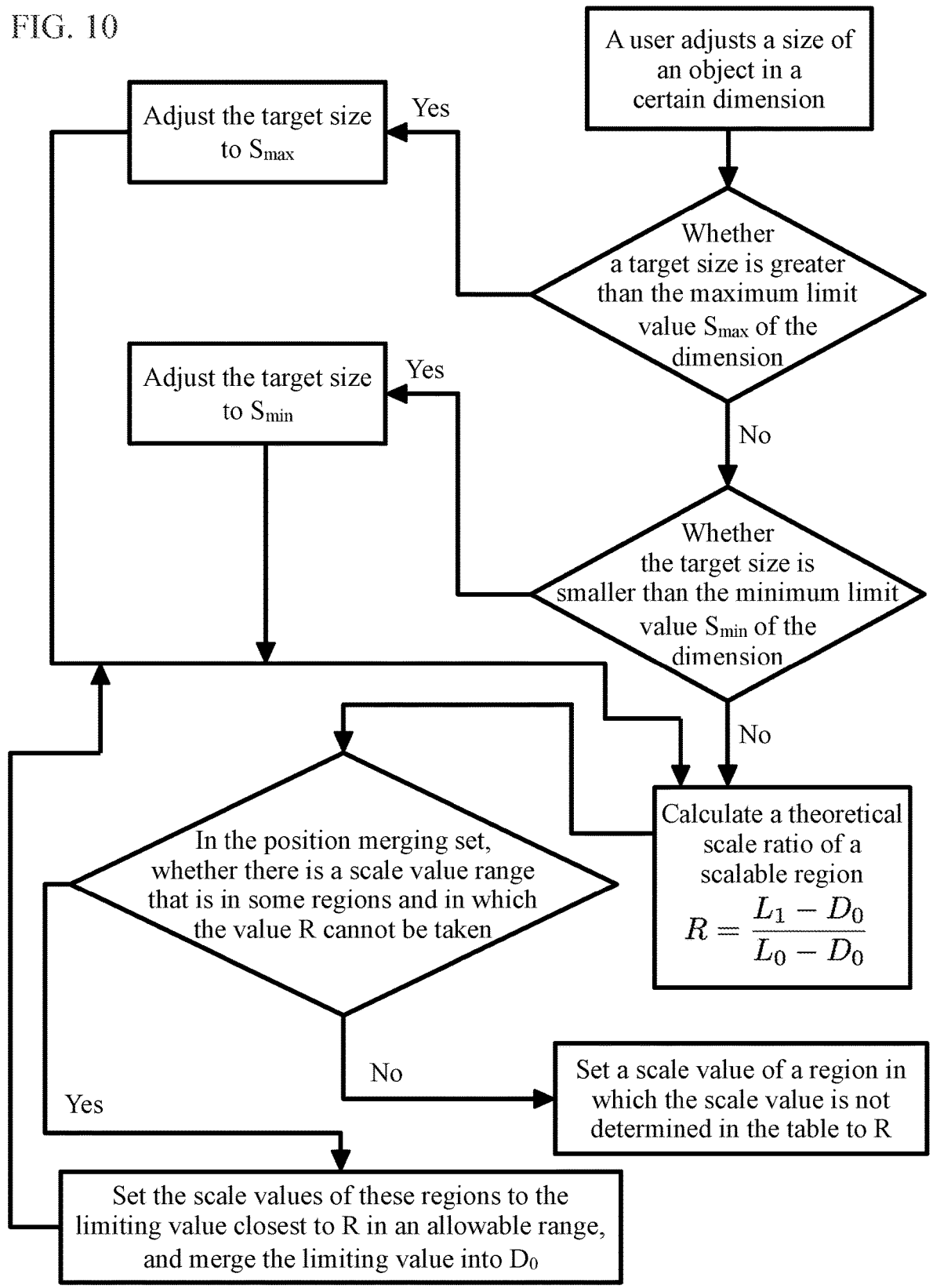
FIG. 10 is a flowchart of calculating a scale ratio according to an embodiment of the present invention.

According to an embodiment of the present invention, the process of calculating the segmented scale ratio of the complex object in the direction may be as shown in FIG. 10. Assuming that an original length of the complex object in a certain direction is $L_0$, a target length of the complex object in the direction is $L_1$, and in the table of the segmented scale ratio range in the direction, the sum of the lengths of the object whose scale ratio has been determined is $D_0$ in the dimension.

First, the user sets an adjustment target value of the overall size of the complex object in a certain direction. It is determined whether the target value exceeds the maximum or minimum value that can be adjusted in the direction. If the target value exceeds the maximum value, the target value is adjusted to the maximum value. If the target value is lower than the minimum value, the target value is adjusted to the minimum value; otherwise, a theoretical scale ratio R of each segment in the complex object is respectively calculated. After the value R of each segment is obtained, if the value R obtained from a certain segment is not within the scale ratio range of the segment, a theoretical scale ratio of the segment is set to a limiting value R' closest to R in the scale ratio range (for example, assuming that in the above table 2, the value R obtained in the interval segment [1,4) is 1.6, the theoretical scale ratio of the segment is set to the limiting value 1.5 closest to 1.6), the value R' is merged into $D_0$, and the scale ratios of other segments are adjusted according to the new $D_0$.

For example, in the example of the palace wall above, according to Table 2 and user settings, $L_0=2.1$, assuming that $L_1=2.75$, the specific segmented scale ratio obtained through merging can be shown through in a form similar to Table 3:

TABLE 3

| Position range | [0, 0.5) | [0.5, 1.8) | [1.8, 2.1) |
|---|---|---|---|
| Scale ratio | 1 | 1.5 | 1 |

Similarly, the specific process of calculating the segmented scale ratio is only an example and should not be regarded as a limitation on the present invention. At the same time, the various steps in the above process can be performed in a different order or in parallel. In some embodiments, only some of the steps or more steps can be included.

Finally, in step S105, a new position range of each sub-object is calculated according to the scale ratio of each sub-object in each direction, and the size of the complex object is adjusted.

For example, when a coordinate zero point, a center position Pos of a sub-object and the original length L of the sub-object are known, a position range of the sub-object in a direction before scaling can be calculated by using the following formula:

$$L1=\text{Pos}-L*0.5$$

$$L2=\text{Pos}+L*0.5$$

L1 and L2 are respectively the closest and farthest distance of the sub-object from the coordinate zero point in the direction. Pos is the center position of the object, and L is the length of the object in the direction.

For L1, a segment in which L1 is in is obtained according to the segmented scale ratio. The new coordinate $L1_{new}$ is obtained by using the following formula:

$$L1_{new}=\int_0^{L1}R(x)dx, \text{ where}$$

R(x) is the scale ratio of the cross section from the origin x.

Similarly, $L2_{new}$ can be obtained by performing the same calculation for L2. The position range of the sub-object in the direction are $L1_{new}$ and $L2_{new}$. Then, the sub-object can be scaled in the direction according to the position range determined by $L1_{new}$ and $L2_{new}$.

The same processing is performed on all sub-objects in the direction in which scaling needs to be performed, so that it can be convenient to implement that the size of the complex object is modified without causing local distortion.

In the above embodiments, a three-dimensional palace wall is taken as an example of a complex object to illustrate the specific operation of the present invention. It should be noted that the present invention can be applied not only to the scaling of a three-dimensional object, but also to the scaling of a two-dimensional complex object, and can also solve the problem of local distortion in two-dimensional scaling. Similarly, it can be understood that the specific description of steps in the above process is only for the convenience of explaining the idea of the present invention. In some cases, the steps may be performed in a different order or performed in parallel. In some embodiments, only some of the steps or more steps may be included.

Figure 2:
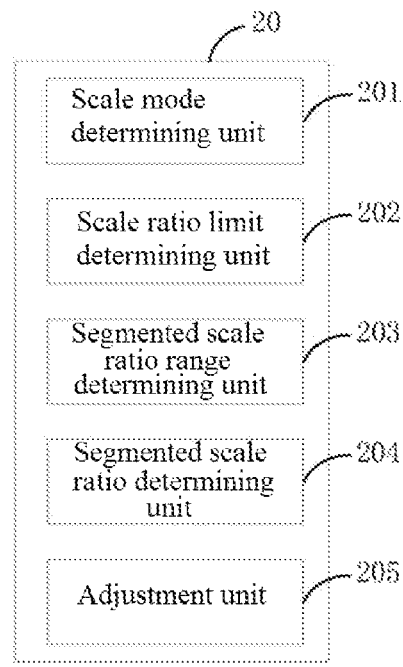
FIG. 2 is a schematic block diagram of a scaling apparatus according to an embodiment of the present invention.

According to another embodiment of the present invention, a scaling apparatus is further provided, as shown in FIG. 2. The scaling apparatus 20 includes a scale mode determining unit 201, configured to assign a scale mode to each sub-object in a complex object in each coordinate axis direction, where the scale mode includes: proportional stretching, non-stretching, and unit repetition; a scale ratio limit determining unit 202, configured to: for each of coordinate axis directions of the complex object, calculate a scale ratio limit of each cross section perpendicular to the direction of the complex object; a segmented scale ratio range determining unit 203, configured to combine adjacent sections with the same scale ratio to obtain a segmented scale ratio range of the complex object in each direction; a segmented scale ratio determining unit 204, configured to: according to an adjustment target value of the complex object in each direction, calculate a segmented scale ratio of the complex object in each direction; and an adjustment unit 205, configured to: according to a scale ratio of each sub-object in each direction, calculate a new position range of each sub-object, and adjust a size of the complex object. The scaling apparatus 20 can perform the scaling method described above with reference to FIG. 1.

Each of the above units can be a logical unit, a physical unit, a part of a physical unit, or a combination of multiple physical units. The physical implementation of these units is not the most important. The combination of the functions implemented by these units is the key to solving the technical problem raised by the present invention. In addition, in different embodiments, in addition to the above units, the present invention may further include other units or modules.

According to another embodiment of the present invention, a computing device is further provided, including a processor and a memory. The processor establishes a communication connection to the memory, and the processor is used to read a program in the memory to perform the method shown in FIG. 1.

According to another embodiment of the present invention, a non-volatile storage medium is further provided. The non-volatile storage medium stores a program. When the program is run by a computing device, the computing device can perform the method shown in FIG. 1. Examples of non-volatile (i.e., non-transitory) storage media include non-volatile read-only memory (NVROM), one or more hard disk drives (HDDs), flash memory, read-only memory (ROM), erasable programmable ROM (EPROM), electrically-erasable programmable ROM (EEPROM), ferroelectric random-access memory (RAM), one or more optical disks, magnetic tapes, floppy disks, and so on.

The embodiments of the present invention are described in detail above with reference to the accompanying drawings, but the use of the technical solution of the present invention is not limited to the various applications mentioned in the embodiments of the patent. Various structures and modifications can be easily implemented by referring to the technical solution of the present invention, to achieve various beneficial effects mentioned in this article. Within the scope of knowledge possessed by persons of ordinary skill in the art, various changes made without departing from the purpose of the present invention should all fall within the scope of the patent of the present invention.

The invention claimed is:

1. A scaling method, comprising:
for each of coordinate axis directions of a complex object:
assigning a scale mode to each sub-object in the complex object in the direction, wherein the scale mode comprises: proportional stretching, non-stretching and unit repetition;
for each cross section of the complex object perpendicular to the direction, calculating a scale ratio limit of the cross section, wherein the calculating a scale ratio limit of the cross section comprises:
determining whether the cross section intersects one or more sub-objects; and if no, setting no limit on the scale ratio; or if yes, limiting the scale ratio of the cross section to not exceed a scale limit value of the sub-object that intersects the cross section in the direction;
combining adjacent cross sections with the same scale ratio to obtain a segmented scale ratio range of the complex object in the direction;
according to an adjustment target value of the complex object in the direction, calculating a segmented scale ratio of the complex object in the direction; and
according to a scale ratio of each sub-object in each direction, calculating a new position range of each sub-object and adjusting a size of the complex object.

2. The scaling method according to claim 1, wherein according to an adjustment target value of the complex object in the direction, the calculating a segmented scale ratio of the complex object in the direction comprises:
determining whether the target value exceeds a maximum or minimum value in the direction;
if the target value exceeds the maximum value, adjusting the target value to the maximum value; if the target value is lower than the minimum value, adjusting the target value to the minimum value; otherwise, separately calculating a theoretical scale ratio R of each segment in the complex object; and
if the value R obtained from a certain segment is not within a scale ratio range of the segment, set the theoretical scale ratio of the segment as a limiting value R' closest to R in the scale ratio range, and adjust scale ratios of other segments according to the value R'.

3. The scaling method according to claim 1, wherein further comprising: decomposing the complex object into sub-objects.

4. The scaling method according to claim 1, wherein when a scale mode of unit repetition is assigned to the sub-object, if a to-be-adjusted target length of the sub-object is not an integral multiple of a repeating unit, a part of the last unit is intercepted according to the final length, or units whose quantity is rounded down are retained and arranged in the center.

5. The scaling method according to claim 1, wherein the complex object is a two-dimensional object or a three-dimensional object.

6. A scaling apparatus, comprising:
a scale mode determining unit, configured to assign a scale mode to each sub-object in a complex object in each coordinate axis direction, wherein the scale mode comprises: proportional stretching, non-stretching, and unit repetition;
a scale ratio limit determining unit, configured to: for each of coordinate axis directions of the complex object, calculate a scale ratio limit of each cross section of the complex object perpendicular to the direction, wherein the scale ratio limit determining unit is further configured to:
for each of coordinate axis directions of the complex object:
determine whether each cross section perpendicular to the direction intersects one or more sub-objects; and
if no, set no limit on the scale ratio; or if yes, limit the scale ratio of the cross section to not exceed a scale limit value of the sub-object that intersects the cross section in the direction;
a segmented scale ratio range determining unit, configured to combine adjacent cross sections with the same scale ratio to obtain a segmented scale ratio range of the complex object in each direction;
a segmented scale ratio determining unit, configured to: according to an adjustment target value of the complex object in each direction, calculate a segmented scale ratio of the complex object in each direction; and
an adjustment unit, configured to: according to a scale ratio of each sub-object in each direction, calculate a new position range of each sub-object, and adjust a size of the complex object.

7. The scaling apparatus according to claim 6, wherein the segmented scale ratio determining unit is further configured to:
for each of coordinate axis directions of the complex object:
determine whether the target value exceeds a maximum or minimum value in the direction;
if the target value exceeds the maximum value, adjust the target value to the maximum value; if the target value is lower than the minimum value, adjust the target value to the minimum value; otherwise, separately calculate a theoretical scale ratio R of each segment in the complex object; and
if the value R obtained from a certain segment is not within a scale ratio range of the segment, set the theoretical scale ratio of the segment as a limiting value R' closest to R in the scale ratio range, and adjust scale ratios of other segments according to the value R'.

8. The scaling apparatus according to claim 6, wherein further comprising a decomposition unit configured to decompose the complex object into the sub-objects.

9. The scaling apparatus according to claim 6, wherein the scale mode determining unit is further configured to, when a scale mode of unit repetition is assigned to the sub-object, if a to-be-adjusted target length of the sub-object is not an integral multiple of a repeating unit, a part of the last unit is intercepted according to the final length, or units whose quantity is rounded down are retained and arranged in the center.

10. The scaling apparatus according to claim 6, wherein the complex object is a two-dimensional object or a three-dimensional object.

11. A device, comprising: a processor and a memory, wherein the processor establishes a communication connection to the memory; and
the processor is configured to read a program in the memory to perform a method comprising, for each of coordinate axis directions of a complex object:

assigning a scale mode to each sub-object in the complex object in the direction, wherein the scale mode comprises: proportional stretching, non-stretching and unit repetition;

for each cross section of the complex object perpendicular to the direction, calculating a scale ratio limit of the cross section, wherein the calculating a scale ratio limit of the cross section comprises:

determining whether the cross section intersects one or more sub-objects; and if no, setting no limit on the scale ratio; or if yes, limiting the scale ratio of the cross section to not exceed a scale limit value of the sub-object that intersects the cross section in the direction;

combining adjacent cross sections with the same scale ratio to obtain a segmented scale ratio range of the complex object in the direction;

according to an adjustment target value of the complex object in the direction, calculating a segmented scale ratio of the complex object in the direction; and according to a scale ratio of each sub-object in each direction, calculating a new position range of each sub-object and adjusting a size of the complex object.

12. A non-transitory storage medium, wherein a program is stored in the non-transitory storage medium, and when the program is run by a computing device, the computing device performs a method comprising, for each of coordinate axis directions of a complex object:

assigning a scale mode to each sub-object in the complex object in the direction, wherein the scale mode comprises: proportional stretching, non-stretching and unit repetition;

for each cross section of the complex object perpendicular to the direction, calculating a scale ratio limit of the cross section, wherein the calculating a scale ratio limit of the cross section comprises:

determining whether the cross section intersects one or more sub-objects; and if no, setting no limit on the scale ratio; or if yes, limiting the scale ratio of the cross section to not exceed a scale limit value of the sub-object that intersects the cross section in the direction;

combining adjacent cross sections with the same scale ratio to obtain a segmented scale ratio range of the complex object in the direction;

according to an adjustment target value of the complex object in the direction, calculating a segmented scale ratio of the complex object in the direction; and according to a scale ratio of each sub-object in each direction, calculating a new position range of each sub-object and adjusting a size of the complex object.

13. The non-transitory storage medium according to claim 12, wherein according to an adjustment target value of the complex object in the direction, the calculating a segmented scale ratio of the complex object in the direction comprises:

determining whether the target value exceeds a maximum or minimum value in the direction;

if the target value exceeds the maximum value, adjusting the target value to the maximum value; if the target value is lower than the minimum value, adjusting the target value to the minimum value; otherwise, separately calculating a theoretical scale ratio R of each segment in the complex object; and if the value R obtained from a certain segment is not within a scale ratio range of the segment, set the theoretical scale ratio of the segment as a limiting value R' closest to R in the scale ratio range, and adjust scale ratios of other segments according to the value R'.

14. The non-transitory storage medium according to claim 12, wherein further comprising: decomposing the complex object into sub-objects.

15. The non-transitory storage medium according to claim 12, wherein when a scale mode of unit repetition is assigned to the sub-object, if a to-be-adjusted target length of the sub-object is not an integral multiple of a repeating unit, a part of the last unit is intercepted according to the final length, or units whose quantity is rounded down are retained and arranged in the center.

16. The non-transitory storage medium according to claim 12, wherein the complex object is a two-dimensional object or a three-dimensional object.

* * * * *